(12) United States Patent
Chiu et al.

(10) Patent No.: US 11,222,852 B2
(45) Date of Patent: *Jan. 11, 2022

(54) METHOD FOR FABRICATING ELECTRONIC PACKAGE

(71) Applicant: Siliconware Precision Industries Co., Ltd., Taichung (TW)

(72) Inventors: Chih-Hsien Chiu, Taichung (TW); Chia-Yang Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/573,276

(22) Filed: Sep. 17, 2019

(65) Prior Publication Data

US 2020/0013728 A1 Jan. 9, 2020

Related U.S. Application Data

(62) Division of application No. 15/660,227, filed on Jul. 26, 2017, now Pat. No. 10,461,041.

(30) Foreign Application Priority Data

Apr. 28, 2017 (TW) .................. 106114243

(51) Int. Cl.
| | | |
|---|---|---|
| *H01L 23/552* | (2006.01) | |
| *H01L 23/66* | (2006.01) | |
| *H01L 23/31* | (2006.01) | |
| *H01L 21/56* | (2006.01) | |
| *H01Q 23/00* | (2006.01) | |

(52) U.S. Cl.
CPC .......... *H01L 23/552* (2013.01); *H01L 21/568* (2013.01); *H01L 23/3121* (2013.01); *H01L 23/3128* (2013.01); *H01L 23/66* (2013.01); *H01L 2223/6627* (2013.01); *H01L 2224/16225* (2013.01); *H01L 2924/181* (2013.01); *H01L 2924/19105* (2013.01); *H01L 2924/19106* (2013.01); *H01Q 23/00* (2013.01)

(58) Field of Classification Search
CPC ............ H01L 23/66; H01L 2223/6677; H01Q 1/2283
See application file for complete search history.

(56) References Cited

U.S. PATENT DOCUMENTS

| | | | |
|---|---|---|---|
| 6,917,526 B2* | 7/2005 | Ajioka | H01L 23/552 |
| | | | 257/E23.114 |
| 6,958,732 B2 | 10/2005 | Yuanzhu | |
| 7,514,774 B2* | 4/2009 | Leung | H01L 23/5385 |
| | | | 257/668 |

(Continued)

*Primary Examiner* — David A Zarneke (74) *Attorney, Agent, or Firm* — Mintz Levin Cohn Ferris Glovsky and Popeo, P.C.; Peter F. Corless; Steven M. Jensen (57) ABSTRACT

An electronic package and a method for fabricating the same are provided. The method includes disposing an electronic component on a lower side of a first carrier and forming an encapsulant on an upper side of the first carrier. A first conductor is disposed on the encapsulant and configured for generating radiation energy by an alternating voltage, an alternating current or radiation variation. As such, the electronic package has a reduced thickness and improved antenna efficiency.

6 Claims, 6 Drawing Sheets

(56) References Cited

U.S. PATENT DOCUMENTS

| | | | |
|---|---|---|---|
| 7,782,624 B2 * | 8/2010 | Fujii | H01L 23/3677 |
| | | | 361/720 |
| 8,786,060 B2 * | 7/2014 | Yen | H01Q 9/0407 |
| | | | 257/660 |
| 8,816,906 B2 | 8/2014 | Kamgaing et al. | |
| 8,866,292 B2 | 10/2014 | Beer et al. | |
| 8,912,959 B2 | 12/2014 | Chiu et al. | |
| 8,952,521 B2 | 2/2015 | Wojnowski et al. | |
| 9,007,273 B2 * | 4/2015 | Liao | H01Q 1/526 |
| | | | 343/841 |
| 9,129,954 B2 * | 9/2015 | Yen | H01Q 1/2283 |
| 9,153,542 B2 * | 10/2015 | Lin | H01L 23/66 |
| 9,245,858 B2 * | 1/2016 | Han | H01L 21/561 |
| 9,245,859 B2 * | 1/2016 | Fujita | H01L 23/13 |
| 9,433,117 B1 * | 8/2016 | Chun | H01L 23/3128 |
| 9,693,492 B2 * | 6/2017 | Kitsukawa | H01L 23/552 |
| 9,754,853 B2 * | 9/2017 | Auchere | H01Q 1/2283 |
| 9,935,065 B1 * | 4/2018 | Baheti | H01L 23/49822 |
| 10,032,722 B2 * | 7/2018 | Yu | H01L 23/5384 |
| 10,096,558 B1 | 10/2018 | Chiang et al. | |
| 10,354,964 B2 * | 7/2019 | Yu | H01L 24/19 |
| 10,833,394 B2 * | 11/2020 | Tsai | H01L 25/50 |
| 2009/0267221 A1 | 10/2009 | Fujii | |
| 2010/0073255 A1 | 3/2010 | Noll et al. | |
| 2010/0164671 A1 | 7/2010 | Pagani et al. | |
| 2013/0015544 A1 | 1/2013 | Han et al. | |
| 2014/0168014 A1 | 6/2014 | Chih et al. | |
| 2014/0210672 A1 | 7/2014 | Chiu et al. | |
| 2015/0280327 A1 | 10/2015 | Spella | |
| 2017/0201023 A1 | 7/2017 | Chiu et al. | |
| 2018/0053735 A1 * | 2/2018 | Ueda | H01Q 9/0485 |
| 2019/0139897 A1 | 5/2019 | Liang et al. | |

* cited by examiner

METHOD FOR FABRICATING ELECTRONIC PACKAGE

CROSS-REFERENCE TO RELATED APPLICATION(S)

This application is a divisional of copending application U.S. Ser. No. 15/660,227, filed on Jul. 26, 2017, which claims under 35 U.S.C. § 119(a) the benefit of Taiwanese Application No. 106114243, filed Apr. 28, 2017, the entire contents of which are incorporated herein by reference.

BACKGROUND

1. Technical Field

The present disclosure relates to electronic packages, and, more particularly, to an electronic package having an antenna structure and a method for fabricating the same.

2. Description of Related Art

Along with the rapid development of portable electronic products, related products are developed toward the trend of high density, high performance and miniaturization. Accordingly, various types of packages with multi-functions integrated therein are developed to meet the high density and miniaturization requirements of electronic products. For example, wireless communication technologies have been widely applied in various types of consumer electronic products to facilitate receiving/sending of wireless signals Therein, patch antennas have been widely applied in wireless communication modules of electronic products such as cell phones and personal digital assistants (PDAs) due to their advantages of small size, light weight and easy fabrication.

Figure 1:
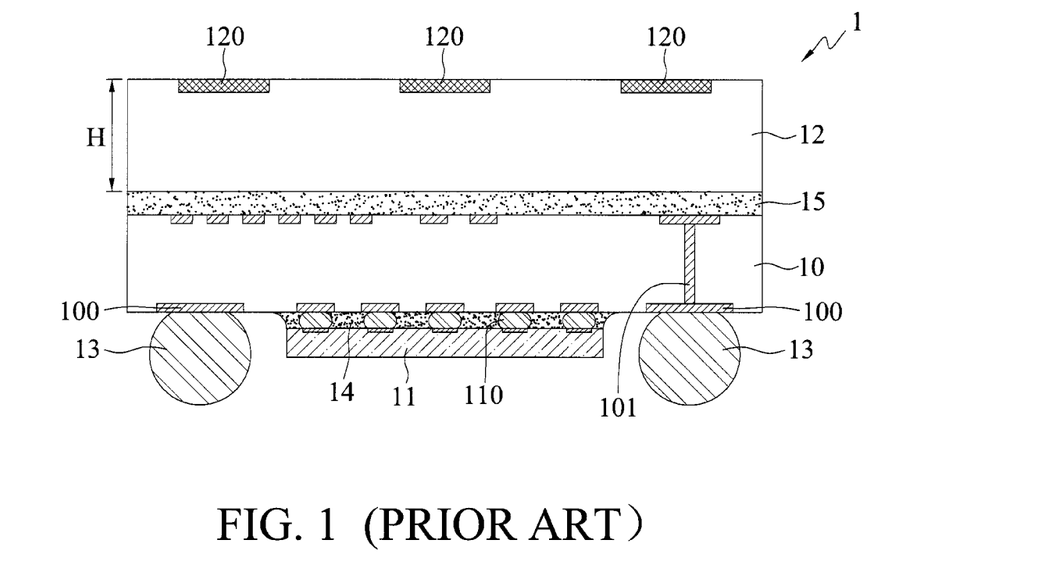
FIG. 1 is a schematic cross-sectional view of a conventional semiconductor communication module.

FIG. 1 is a schematic cross-sectional view of a conventional semiconductor communication module 1. A semiconductor element 11 is disposed on a lower side of a packaging substrate 10 through a plurality of conductive bumps 110. An underfill 14 is formed between the semiconductor element 11 and the packaging substrate 10 to encapsulate the conductive bumps 110. A plurality of solder balls 13 are disposed on I/O pads 100 of the lower side of the packaging substrate 10. An antenna substrate 12 is attached to an upper side of the packaging substrate 10 through an adhesive tape 15. The antenna substrate 12 is made of an organic board such as a printed circuit board, and an antenna body 120 made of metal is formed on an upper side of the antenna substrate 12 for integrating an antenna function with the semiconductor element 11.

However, the antenna substrate 12 made of an organic board and attached to the packaging substrate 10 through the adhesive tape 15 has a great thickness H, thereby hindering miniaturization of the semiconductor communication module 1 and adversely affecting the antenna efficiency of the semiconductor communication module 1.

Furthermore, tolerances from, for example, fabrication of the antenna substrate 12 and fabrication and attaching of the adhesive tape 15 may accumulate. Consequently, the thickness of the semiconductor communication module 1 cannot be accurately controlled and hence the miniaturization of the semiconductor communication module 1 is hindered.

Therefore, there is a need to provide an electronic package and a fabrication method thereof so as to overcome the above-described drawbacks.

SUMMARY

In view of the above-described drawbacks, the disclosure provides an electronic package, which comprises: a first carrier having a first side and a second side opposite to the first side; at least one electronic component disposed on the first side and/or the second side of the first carrier; an encapsulant formed on the second side of the first carrier; and a first conductor disposed on the encapsulant and configured for generating radiation energy by an alternating voltage, an alternating current or radiation variation.

The disclosure further provides a method for fabricating an electronic package, comprising: providing a first carrier having a first side and a second side opposite to the first side; disposing at least one electronic component on the first side and/or the second side of the first carrier; forming an encapsulant on the second side of the first carrier; and disposing on the encapsulant a first conductor configured for generating radiation energy by an alternating voltage, an alternating current or radiation variation.

In an embodiment, a second conductor can be formed on the second side of the first carrier and correspond in function to the first conductor.

In an embodiment, a shielding layer can be formed in the first carrier. In another embodiment, the shielding layer has a layout area greater than that of the second conductor.

In an embodiment, the encapsulant can be further formed on the first side of the first carrier to encapsulate the electronic component.

In an embodiment, the method can further comprise bonding a plurality of supporting members to the first side of the first carrier.

In an embodiment, the method can further comprise stacking a second carrier on the first side of the first carrier. In another embodiment, the second carrier has a third conductor formed and corresponding in function to the first conductor. In yet another embodiment, the second carrier further has a shielding layer formed therein.

In an embodiment, the method can further comprise forming a shielding body on lateral surfaces of the encapsulant and the first carrier and/or over the electronic component.

According to the present disclosure, after the encapsulant is formed on the first carrier, the first conductor having an antenna function is disposed on the encapsulant to replace the conventional antenna substrate and adhesive tape. Therefore, the present disclosure effectively reduces the thickness of the electronic package so as to meet the miniaturization requirement and improve the antenna efficiency of the electronic package.

Further, by dispensing with the conventional antenna substrate, the present disclosure avoids tolerance accumulation. Hence, the thickness of the electronic package can be accurately controlled so as to meet the miniaturization requirement.

BRIEF DESCRIPTION OF DRAWINGS

FIG. 2D' is a schematic cross-sectional view showing another embodiment of FIG. 2D;

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A to 2D are schematic cross-sectional views showing a method for fabricating an electronic package 2 according to the present disclosure.

Figure 2A:
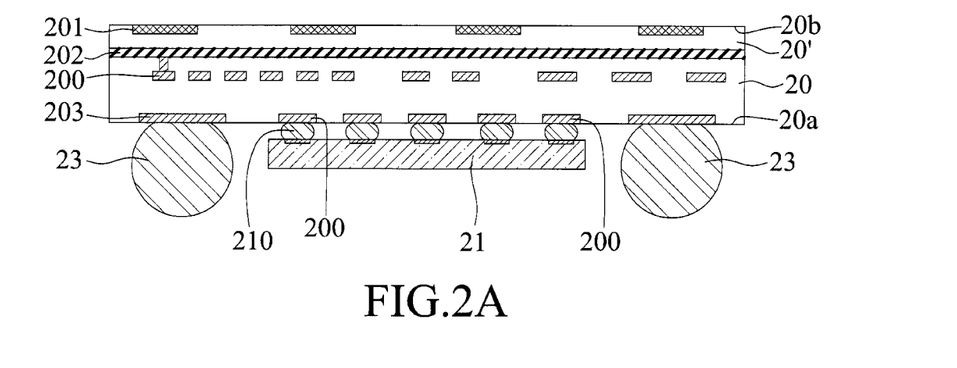
FIGS. 2A to 2D are schematic cross-sectional views showing a method for fabricating an electronic package according to the present disclosure.

Referring to FIG. 2A, a first carrier 20 having a first side 20a and a second side 20b opposite to the first side 20a is provided, at least one first electronic component 21 is disposed on the first side 20a of the first carrier 20, and a plurality of supporting members 23 are bonded to the first side 20a of the first carrier 20.

In an embodiment, the first carrier 20 is a packaging substrate having a core layer and a circuit structure, or a coreless circuit structure. In another embodiment, a plurality of circuit layers 200 such as fan-out redistribution layers are formed on a dielectric material. In yet another embodiment, the first carrier 20 can be a carrying unit for carrying an electronic component such as a chip. In still another embodiment, the first carrier 20 is a lead frame.

In an embodiment, a second conductor 201 is disposed on the second side 20b of the first carrier 20. Preferably, a first shielding layer 202 is formed in the first carrier 20. In another embodiment, the first shielding layer 202 has a layout area greater than that of the second conductor 201. In an embodiment, the first shielding layer 202 can be made of a complete metal foil, or a metal foil having a mesh shape or any other pattern. In another embodiment, the first shielding layer 202 can be made of a patterned conductive material. A dielectric body 20' is formed between the second conductor 201 and the first shielding layer 202. In an embodiment, the dielectric body 20' can be made of such as prepreg, polyimide, epoxy resin or glass fiber.

In an embodiment, the first electronic component 21 can be an active element such as a semiconductor chip, a passive element, such as a resistor, a capacitor or an inductor, or a combination thereof. In an embodiment, the first electronic component 21 is a semiconductor chip, which is disposed on in a flip-chip manner and electrically connected to the circuit layers 200 through a plurality of conductive bumps 210. In an embodiment, the conductive bumps 210 are made of a solder material. In another embodiment, the first electronic component 21 can be electrically connected to the circuit layers 200 through a plurality of bonding wires (not shown), or be in direct contact with the circuit layers 200.

In an embodiment, the supporting members 23 are solder balls, which are mounted on conductive pads 203 of the circuit layers 200 on the first side 20a of the first carrier 20 so as to be electrically connected to the first carrier 20.

Figure 2B:
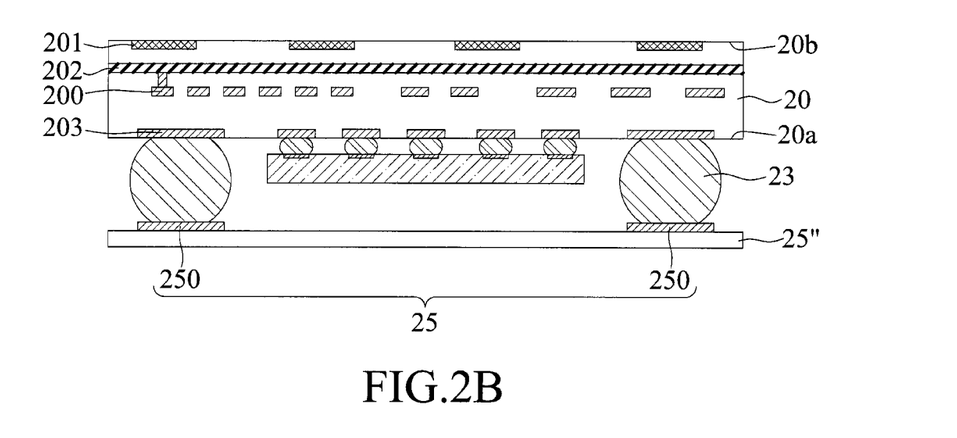

Referring to FIG. 2B, the first carrier 20 is stacked on a second carrier 25 through the supporting members 23.

In an embodiment, the second carrier 25 is a metal frame such as a lead frame. The second carrier 25 has a plurality of conductive pads 250 that are separated from one another, and the supporting members 23 are bonded to the conductive pads 250.

In an embodiment, the second carrier 25 is disposed on an adhesive tape 25" first, and then the first carrier 20 is bonded to the second carrier 25.

In an embodiment, the first carrier 20 can be stacked on the second carrier 25 by soldering, adhering, ultrasonic techniques etc., and hence the supporting members 23 are not limited to solder balls.

Figure 2C:
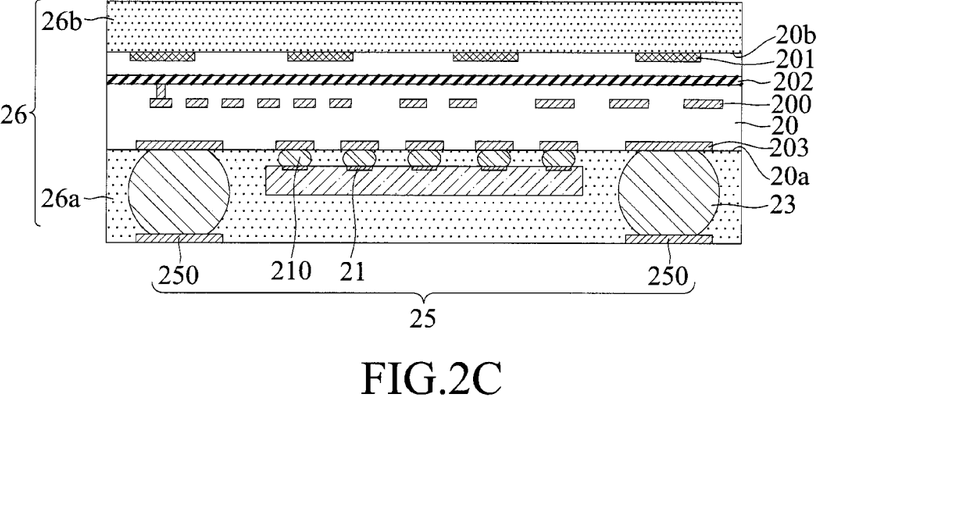

Referring to FIG. 2C, an encapsulant 26 is formed on the first side 20a and the second side 20b of the first carrier 20. Then, the adhesive tape 25" is removed.

In an embodiment, the encapsulant 26 is formed through a double-side molding process. The encapsulant formed on the first side 20a of the first carrier 20 is defined as a first encapsulant 26a and the encapsulant formed on the second side 20b of the first carrier 20 is defined as a second encapsulant 26b. The first encapsulant 26a encapsulates the first electronic component 21 and the supporting members 23, with the conductive pads 250 exposed from the first encapsulant 26a. In an embodiment, lower surfaces of the conductive pads 250 are flush with a lower surface of the encapsulant 26. As such, external connection members such as solder balls (not shown) can be disposed on the lower surfaces of the conductive pads 250 for bonding with an electronic device such as a printed circuit board (not shown).

In an embodiment, the encapsulant 26 can be made of, but not limited to, polyimide, a dry film, an epoxy resin or a molding compound.

Figure 2D:
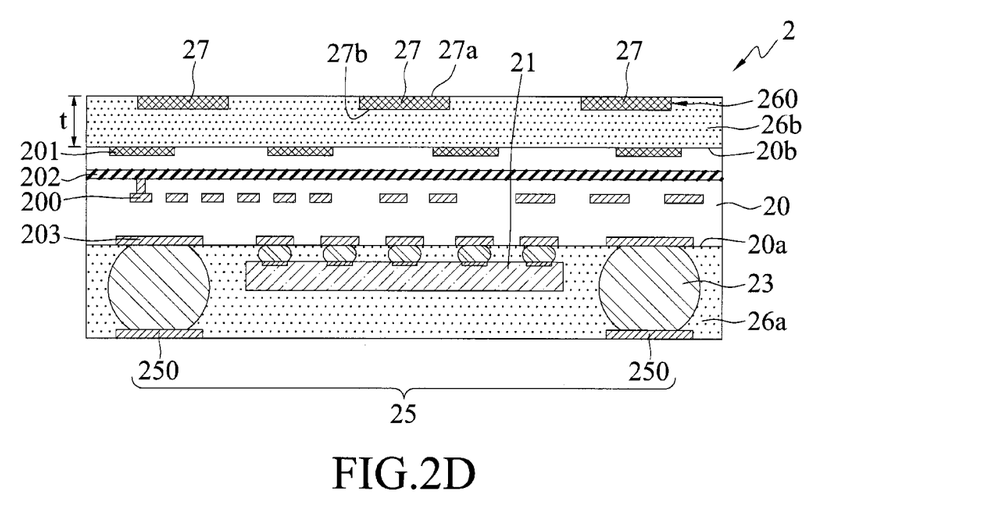

Referring to FIG. 2D, a first conductor 27 configured for generating radiation energy by an alternating voltage, an alternating current or radiation variation is disposed on the second encapsulant 26b, and corresponds in position to the second conductor 201. The first conductor 27 has a first surface 27a bonded to the second encapsulant 26b and a second surface 27b opposite to the first surface 27a and exposed from the second encapsulant 26b.

In an embodiment, the radiation energy is referred to an electromagnetic field, and the first conductor 27 in a small thickness can be formed by sputtering, evaporation, electroplating, electroless plating, chemical plating or foiling. In an embodiment, a plurality of patterned recesses 260 are formed in the second encapsulant 26b first and then a conductive material is formed in the recesses 260 to serve as the first conductor 27. In another embodiment, a patterned conductive material can be directly formed on the second encapsulant 26b to serve as the first conductor 27 (no recess is formed).

FIG. 2D' is a schematic cross-sectional view of an electronic package 2' according to another embodiment of the present disclosure. Referring to FIG. 2D', a single-side molding process is performed to form an encapsulant 26' on the second side 20b of the first carrier 20, and an underfill 24 is formed between the first side 20a of the first carrier 20 and the first electronic component 21 to encapsulate the conductive bumps 210.

In an embodiment, referring to FIG. 2D', the supporting members 23' can be made of an insulating adhesive, a solder paste or a conductive adhesive, and the second carrier 25' can be a semiconductor structure, an insulating structure or a conductive structure. The height of the second carrier 25' can be varied according to the practical need. In an embodiment, the second carrier 25' can be a lead frame, a substrate, a chip, a conductive frame, a non-conductive frame and so on.

To reduce the fabrication cost, the supporting members and the second carrier can be fabricated together. In an embodiment, the supporting members 23' can be formed on the second carrier 25'. After the first conductor 27 is formed, the second carrier 25', and the supporting members 23' as well, are stacked on the conductive pads 203 of the first side 20a of the first carrier 20.

According to the present disclosure, after formation of the encapsulant 26, 26', the first conductor 27 having an antenna pattern is disposed on the encapsulant 26, 26' on the second side 20b of the first carrier 20, thereby dispensing with the conventional antenna substrate and adhesive tape. As such, the present disclosure effectively reduces the thickness of the electronic package 2, 2' so as to meet the miniaturization requirement and improves the antenna efficiency of the electronic package 2, 2'.

Further, by dispensing with the conventional antenna substrate, the present disclosure avoids tolerance accumulation. Hence, the thickness of the electronic package 2, 2' can be accurately controlled so as to meet the miniaturization requirement.

In addition, the first shielding layer 202 prevents crosstalk, noise interference and radiation interference from the first and/or second conductors 27, 201 to the first electronic component 21. Preferably, the first shielding layer 202 is made of multiple layers of metal foils to enhance the above-described function.

Figure 3A:
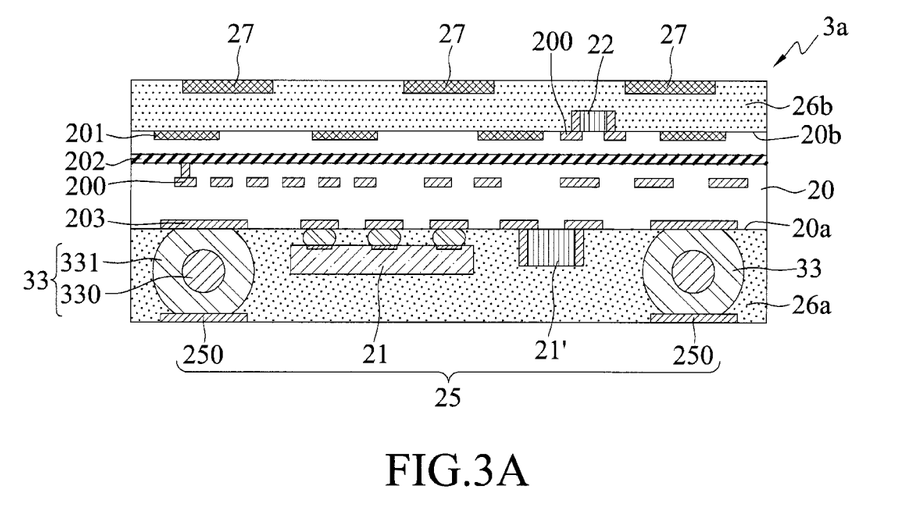
FIGS. 3A to 3C are schematic cross-sectional views showing various embodiments of FIG. 2D.
Figure 3B:
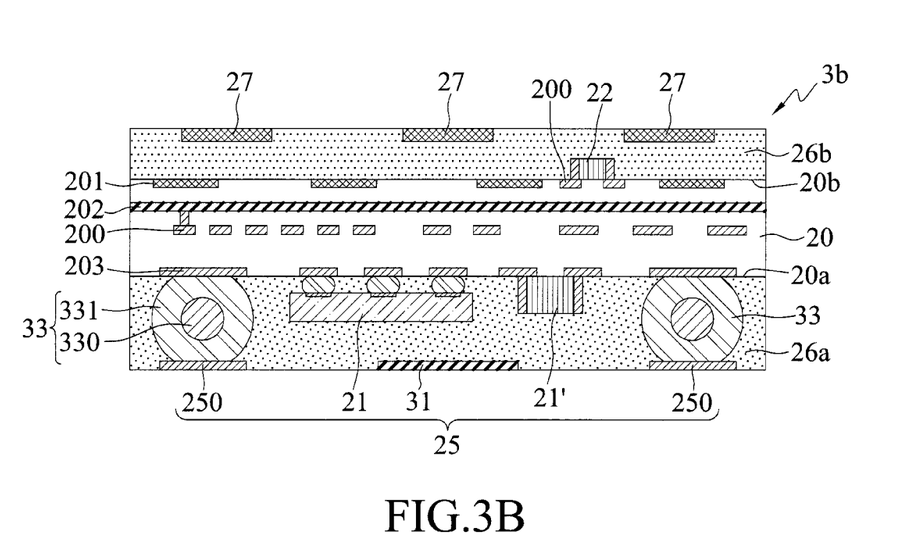
Figure 3C:
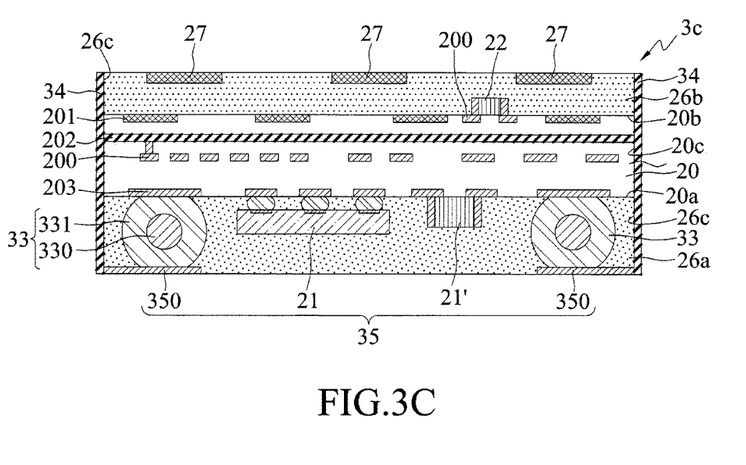

FIGS. 3A to 3C are schematic cross-sectional views showing various embodiments of FIG. 2D.

In the electronic package 3a of FIG. 3A, a plurality of first electronic components 21, 21' are disposed on the first side 20a of the first carrier 20, and at least one of the first electronic components 21' is a passive element. Further, a second electronic component 22 is disposed on the second side 20b of the first carrier 20.

In an embodiment, the second electronic component 22 is an active element such as a semiconductor chip, a passive element, such as a resistor, a capacitor or an inductor, or a combination thereof. The electronic component can be disposed on the first side 20a and/or the second side 20b according to the practical need. In an embodiment, the second electronic component 22 is in direct contact with the circuit layers 200. In another embodiment, the second electronic component 22 is electrically connected to the circuit layers 200 in a flip-chip manner or through wire bonding.

In an embodiment, the supporting members 33 are copper core balls, each having a copper bump 330 and a solder material 331 covering the copper bump 330. In another embodiment, the supporting members can be passive elements, such as resistors, capacitors and inductors. In yet another embodiment, the supporting members are decoupling capacitors. In further embodiment, the supporting members can be made of such as a pin-shaped or post-shaped metal material. The above-described aspects can be combined in the same package.

Referring to FIG. 3B, the electronic package 3b differs from the electronic package 3a in that a shielding body 31 is further formed corresponding in position to the first electronic component 21 for heat dissipation or shielding.

In an embodiment, the shielding body 31 can be formed by sputtering, evaporation, electroplating, chemical plating or foiling. The conductive pads 250 are positioned around a periphery of the shielding body 31 and separated from the shielding body 31. In an embodiment, the shielding body 31 can be electrically connected to at least one of the conductive pads 250.

The shielding body 31 is not in contact with the first electronic component 21. In an embodiment, the shielding body 31 is separated from the first electronic component 21 by the encapsulant 26 or an air gap. In another embodiment, the shielding body 31 can be in contact with the first electronic component 21 (not shown), or the shielding body 31 can be bonded to the first electronic component 21 through a bonding layer (not shown). In an embodiment, the bonding layer is a thin film, an epoxy resin or a thermal interface material.

In an embodiment, the shielding body 31 and the conductive pads 250 can have the same or different heights (thicknesses). In an embodiment, the shielding body 31 and the conductive pads 250 can be integrally formed. That is, the second carrier 25 includes the shielding body 31.

In another embodiment, referring to FIG. 3C, the shielding body 34 is formed on a lateral surface 26c of the encapsulant 26 and a lateral surface 20c of the first carrier 20 and even extends on the second carrier 35 for shielding. In an embodiment, the conductive pads 350 are exposed from the lateral surface 26c of the encapsulant 26 so as to come into contact with the shielding body 34. The electronic package 3c has a structure similar to QFN (quad flat no-leads).

Figure 4A:
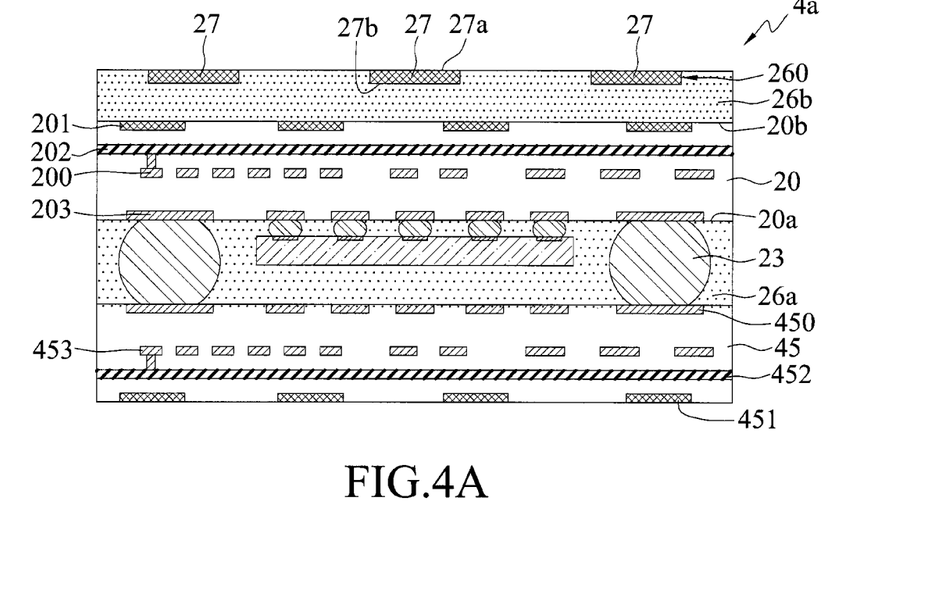
FIGS. 4A and 4B are schematic cross-sectional views showing a further embodiment of FIG. 2D.
Figure 4B:
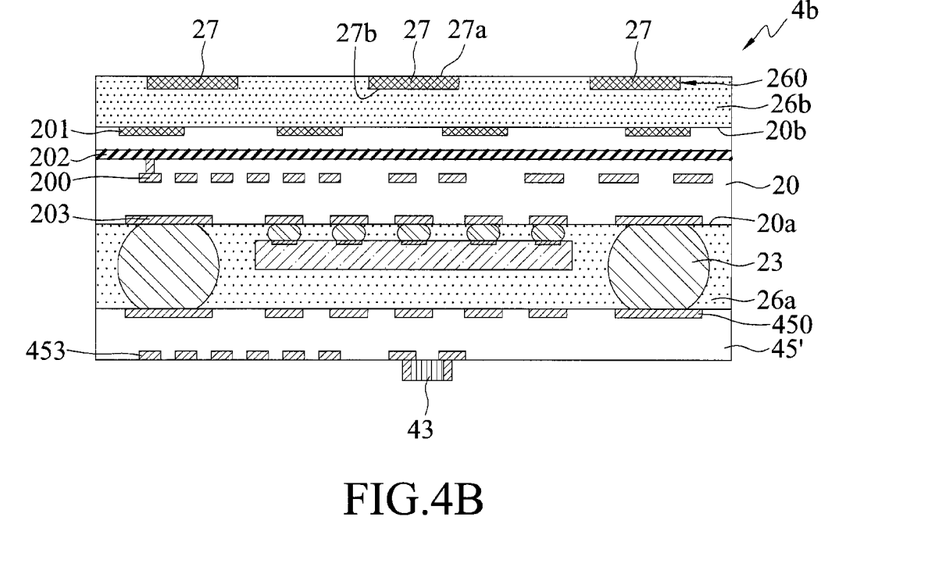

FIGS. 4A and 4B are schematic cross-sectional views showing a further embodiment of FIG. 2D.

In the electronic package 4a of FIG. 4A, the second carrier 45 is a circuit structure, for example, a packaging substrate having a core layer and a circuit structure, or a coreless circuit structure. The second carrier 45 and the first carrier 20 can have identical or similar structures.

In an embodiment, the second carrier 45 has a plurality of circuit layers 453, a plurality of conductive pads 450 bonded to the supporting members 23 and electrically connected to the circuit layers 453, and a third conductor 451 corresponding in function to the first conductor 27. The second carrier 45 can further have a second shielding layer 452 electrically connected to the circuit layers 453. The process of the third conductor 451 and the second shielding layer 452 can be referred to the process of the second conductor 201 and the first shielding layer 202.

Further, in the electronic package 4b of FIG. 4B, a third electronic component 43 can be disposed on the second carrier 45' according to the practical need. For example, the structure of the second carrier 45' is different from the structure of the first carrier 20. In an embodiment, the second carrier 45' does not have the third conductor 451 and the second shielding layer 452. The third electronic component 43 is an active element such as a semiconductor chip, a passive element, such as a resistor, a capacitor or an inductor, or a combination thereof.

In an embodiment, the second carrier 45' can be a silicon interposer having a plurality of through silicon vias (TSVs).

The present disclosure further provides an electronic package 2, 2', 3a, 3b, 3c, 4a, 4b, which has: a first carrier 20 having a first side 20a and a second side 20b opposite to the first side 20a; at least one first electronic component 21, 21' disposed on the first side 20a of the first carrier 20; a plurality of supporting members 23, 23', 33 bonded to the first side 20a of the first carrier 20; an encapsulant 26, 26' formed on the first carrier 20, wherein a first encapsulant 26a is defined on the first side 20a of the first carrier 20 and a second encapsulant 26b is defined on the second side 20b of the first carrier 20; a first conductor 27 disposed on the encapsulant 26, 26' (the second encapsulant 26b) and configured for generating radiation energy by an alternating voltage, an alternating current or radiation variation; and a second carrier 25, 25', 35, 45, 45' stacked on the first side 20a of the first carrier 20.

In an embodiment, a second conductor 201 is disposed on the second side 20b of the first carrier 20 and corresponds in function to the first conductor 27, and a first shielding layer 202 is formed in the first carrier 20. The layout area of the first shielding layer 202 is greater than that of the second conductor 201.

In an embodiment, at least one second electronic component 22 is disposed on the second side 20b of the first carrier 20. In an embodiment, the electronic component can be disposed on the first side 20a and/or the second side 20b of the first carrier 20 according to the practical need.

In an embodiment, the first electronic component 21, 21' is electrically connected to circuit layers 200 of the first carrier 20.

In an embodiment, the encapsulant 26 is further formed on the first side 20a of the first carrier 20 (i.e., the first encapsulant 26a) to encapsulate the first electronic component 21, 21'.

In an embodiment, the second carrier 25, 35, 45, 45' further has a plurality of conductive pads 250, 350, 450 bonded to the supporting members 23, 33.

In an embodiment, the second carrier 45 further has a third conductor 451 corresponding in function to the first conductor 27, and a second shielding layer 452.

In an embodiment, at least one third electronic component 43 is disposed on the second carrier 45'.

In an embodiment, the electronic package 3b further has a shielding body 31 formed over the first electronic component 21, 21'.

In an embodiment, the electronic package 3c further has a shielding body 34 formed on lateral surfaces of the encapsulant 26, the first carrier 20 and the second carrier 35. According to the present disclosure, a conductor having an antenna function is formed on the encapsulant of the second side of the first carrier to replace the conventional antenna substrate and adhesive tape. Therefore, the present disclosure effectively reduces the thickness of the electronic package so as to meet the miniaturization requirement and improves the antenna efficiency of the electronic package.

Further, by dispensing with the conventional antenna substrate, the present disclosure avoids tolerance accumulation. Hence, the thickness of the electronic package can be accurately controlled so as to meet the miniaturization requirement.

The above-described descriptions of the detailed embodiments are only to illustrate the implementation according to the present disclosure, and it is not to limit the scope of the present disclosure. Accordingly, all modifications and variations completed by those with ordinary skill in the art should fall within the scope of the present disclosure defined by the appended claims.

What is claimed is:

1. A method for fabricating an electronic package, comprising:
    providing a first carrier having a first side and a second side opposite to the first side;
    disposing at least one electronic component on at least one of the first side and the second side of the first carrier;
    forming an encapsulant on the second side of the first carrier;
    disposing on the encapsulant a first conductor configured for generating radiation energy by an alternating voltage, an alternating current or radiation variation;
    disposing on the second side of the first carrier a second conductor corresponding in function to the first conductor; and
    stacking a second carrier on the first side of the first carrier, wherein the second carrier has a second shielding layer and a third conductor corresponding in function to the first conductor, and the second shielding layer is between the electronic component and the third conductor.

2. The method of claim 1, further comprising forming a first shielding layer in the first carrier.

3. The method of claim 2, wherein the first shielding layer is greater than the second conductor in a layout area in the first carrier.

4. The method of claim 1, wherein the encapsulant is further formed on the first side of the first carrier.

5. The method of claim 1, further comprising bonding a plurality of supporting members to the first side of the first carrier.

6. The method of claim 1, further comprising forming a shielding body on lateral surfaces of the encapsulant and the first carrier and/or over the electronic component.

* * * * *